(12) United States Patent
Shim et al.

(10) Patent No.: US 11,500,603 B2
(45) Date of Patent: Nov. 15, 2022

(54) COUPLING DISPLAY DEVICE AND TILED DISPLAY DEVICE HAVING THE SAME

(71) Applicant: Samsung Display Co., Ltd., Yongin-Si (KR)

(72) Inventors: Seungbo Shim, Asan-si (KR); Jinsuek Kim, Suwon-si (KR); Saeron Park, Hwaseong-si (KR); Hokil Oh, Seoul (KR); Eunggyu Lee, Cheonan-si (KR); Jae-Soo Jang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/393,683

(22) Filed: Aug. 4, 2021

(65) Prior Publication Data

US 2022/0050653 A1 Feb. 17, 2022

(30) Foreign Application Priority Data

Aug. 11, 2020 (KR) .......................... 10-2020-0100412

(51) Int. Cl.
*G06F 3/14* (2006.01)
*G09G 3/00* (2006.01)
(Continued)

(52) U.S. Cl.
CPC ............. *G06F 3/1446* (2013.01); *G09G 3/03* (2020.08); *G09G 3/3208* (2013.01); *H01L 27/3293* (2013.01); *G09G 2300/026* (2013.01); *G09G 2310/0243* (2013.01); *G09G 2320/08* (2013.01); *G09G 2340/14* (2013.01); *G09G 2354/00* (2013.01); *G09G 2356/00* (2013.01)

(58) Field of Classification Search
CPC ...... G06F 3/1446; G09G 3/03; G09G 3/3208; G09G 2300/026; G09G 2310/0243; G09G 2320/08; G09G 2340/14; G09G 2354/00; G09G 2356/00; H01L 27/3293
See application file for complete search history.

(56) References Cited

U.S. PATENT DOCUMENTS 8,502,949 B2 * 8/2013 Han .................... G02F 1/13336
349/33
9,196,199 B2 * 11/2015 Shi ...................... G02B 26/0833
(Continued)

FOREIGN PATENT DOCUMENTS

| KR | 100142002 B1 | 6/1998 |
|---|---|---|
| KR | 101157425 B1 | 6/2012 |

(Continued)

*Primary Examiner* — Vijay Shankar
(74) *Attorney, Agent, or Firm* — Cantor Colburn LLP

(57) ABSTRACT

A tile display device includes element display devices, each including an element display panel which defines a display area and a panel driver disposed on a seam area surrounding the display area, and a coupling display device disposed on element display devices and coupled to the element display devices at neighboring seam areas. The coupling display device includes a boundary display panel on the neighboring seam areas, a coupler which couples the boundary display panel to the element display panels to provide a coupling panel structure, a boundary driver which drives the boundary display panel and a signal control center which drives the coupling panel structure.

20 Claims, 7 Drawing Sheets

(51) Int. Cl.
*G09G 3/3208* (2016.01)
*H01L 27/32* (2006.01)

(56) References Cited

U.S. PATENT DOCUMENTS

| | | | |
|---|---|---|---|
| 10,983,381 B2* | 4/2021 | Jeong | G02B 6/0068 |
| 2012/0140160 A1* | 6/2012 | Han | G02F 1/13336 |
| | | | 349/144 |
| 2012/0206684 A1* | 8/2012 | Lee | G02F 1/1337 |
| | | | 445/24 |
| 2014/0225816 A1* | 8/2014 | Shi | G02B 26/001 |
| | | | 345/84 |
| 2020/0159054 A1* | 5/2020 | Jeong | G09G 3/2085 |
| 2021/0109700 A1* | 4/2021 | Yueh | G06F 3/147 |

FOREIGN PATENT DOCUMENTS

| | | |
|---|---|---|
| KR | 1020180071657 A | 6/2018 |
| KR | 1020200030226 A | 3/2020 |

* cited by examiner

COUPLING DISPLAY DEVICE AND TILED DISPLAY DEVICE HAVING THE SAME

This application claims priority to Korean Patent Application No. 10-2020-0100412, filed on Aug. 11, 2020, and all the benefits accruing therefrom under 35 U.S.C. § 119, the content of which in its entirety is herein incorporated by reference.

BACKGROUND

1. Field

Embodiments of the invention relate to a coupling display device and a tiled display device including the coupling display device, and more particularly, to a flexible coupling display device covering and coupling a pair of display devices at neighboring seam areas thereof and a tiled display device including the coupling display device.

2. Description of the Related Art

A tiled display device is a multi panel display system in which a plurality of display panels is tiled or combined with one another into a single display system, so that a display size of the tiled display device may be enlarged over the panel size of the mass-produced standard panel.

A display panel for a conventional display device typically includes a display area at a central portion of the display panel and a non-display area or a seam area enclosing the display area at a peripheral portion of the display panel. A plurality of pixels is arranged on the display area and digital image data are displayed on the display area. Panel sealants for sealing the display panel from surroundings and driving packages for driving the pixels may be arranged on the non-display area of the display panel.

SUMMARY

In a conventional tiled display device, when a plurality of display panels is tiled or combined into a single tiled display device, a display image may be separated or divided into sections by element display panels of the tiled display device by a seam line extending in a seam area between adjacent display panels. Thus, the seam lines in the display image may deteriorate the display quality of the tiled display device.

Embodiments of the invention provide a coupling display device for coupling and covering element display panels into a single coupling panel structure without any deterioration of the image quality and any damages to the neighboring seam areas of the element display panels.

Embodiments of the invention provide a tiled display device including the above coupling display device.

According to an embodiment of the invention, a coupling display device includes a boundary display panel disposed on a plurality of element display panels, where each of the element display panels includes a display area and a seam area surrounding the display area, and the boundary display panel is disposed to cover neighboring seam areas of neighboring element display panels, a coupler which couples the boundary display panel with the neighboring element display panels to provide a coupling panel structure, a boundary driver disposed at an end portion of the boundary display panel to drive the boundary display panel, and a signal control center disposed at an exterior of the boundary display panel and connected to the boundary driver to drive the coupling panel structure to operate in response to a coupling panel driving signal.

According to an embodiment of the invention, a tiled display device includes a plurality of element display devices, each including an element display panel which defines a display area and a panel driver disposed on a seam area surrounding the display area, and a coupling display device disposed on the element display devices, where the coupling display device is coupled to neighboring element display devices at neighboring seam areas of element display panels thereof, and the neighboring seam areas are covered by the coupling display device. In such an embodiment, the coupling display device includes a boundary display panel disposed on the neighboring seam areas of the element display panels of the neighboring element display devices, a coupler which couples the boundary display panel with the element display panels to provide a coupling panel structure, a boundary driver disposed at an end portion of the boundary display panel to drive the boundary display panel, and a signal control center disposed at an exterior of the boundary display panel and connected to the boundary driver and panel drivers of the neighboring element display devices to drive the coupling panel structure to operate in response to a coupling panel driving signal which is converted from a panel driving signal for individually driving the element display panels.

According to embodiments of the invention, neighboring element display devices may be coupled with the coupling display device at the neighboring seam areas. Thus, the element display devices and the coupling display device may constitute a tiled display device that may be operated by a single coupling panel driving signal. In such an embodiment, the coupling display device may be coupled to the neighboring seam areas of the element display devices without any damages to the element display devices and without any seam lines in the boundary area, such that the reliability and stability of the tiled display device may be improved.

In such embodiments, the coupling display device may be positioned at the boundary area between the element display devices as an additional display device, such that the pixel number of the tiled display device may easily increase as many as the pixel number of the coupling display device In such embodiments, the operation mode of the tiled display device may be easily selected among the single mode, the multi panel mode and the blocking mode based on the operation of the mode selector according to the user's instruction, such that the use of ease and the facility of the tiled display device may be improved.

In such embodiments, the coupling display device may be a flexible display panel, and the element display devices may be folded or bent over each other with respect to a separation space of the boundary area therebetween, which covered by the flexible coupling display device, such that the storage space for the tiled display device may be reduced by being folded.

BRIEF DESCRIPTION OF THE DRAWINGS

These and other features of the invention will become more apparent by describing in detail embodiments thereof with reference to the accompanying drawings, in which.

DETAILED DESCRIPTION

Figure 1:
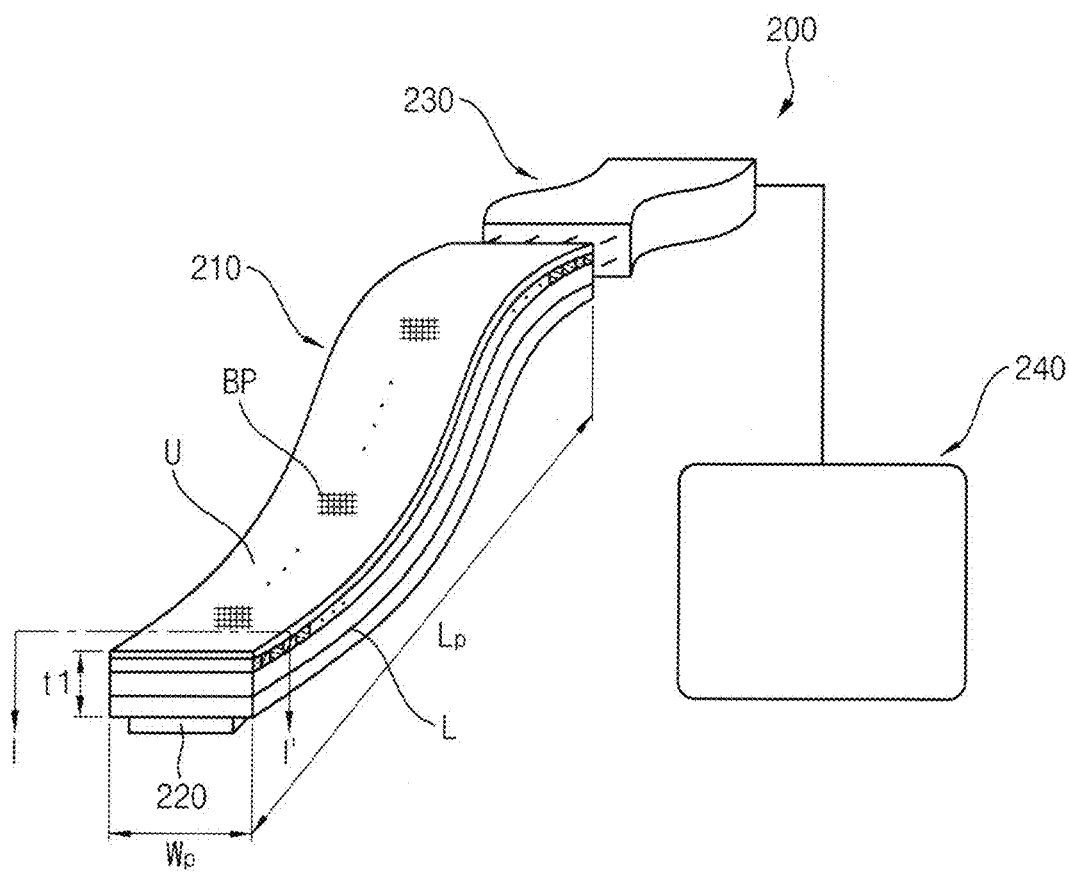
FIG. 1 is a perspective view illustrating a coupling display device in accordance with an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
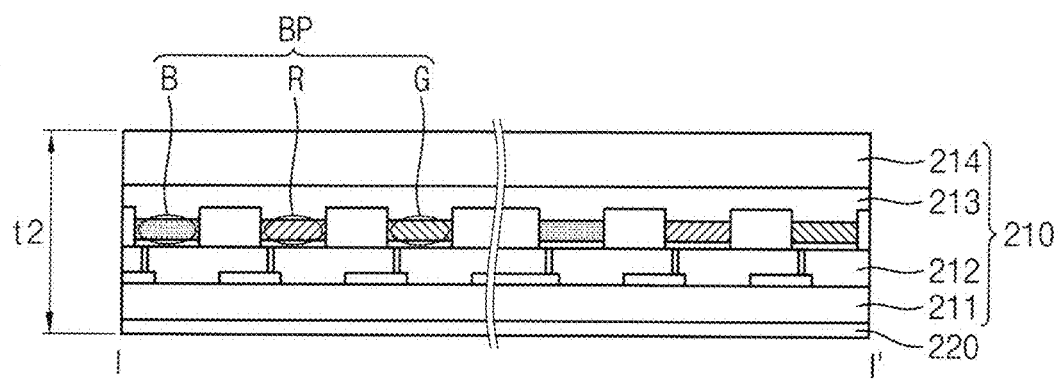
FIG. 2 is a cross-sectional view cut along line I-I' of the coupling display device shown in FIG. 1.
Figure 3:
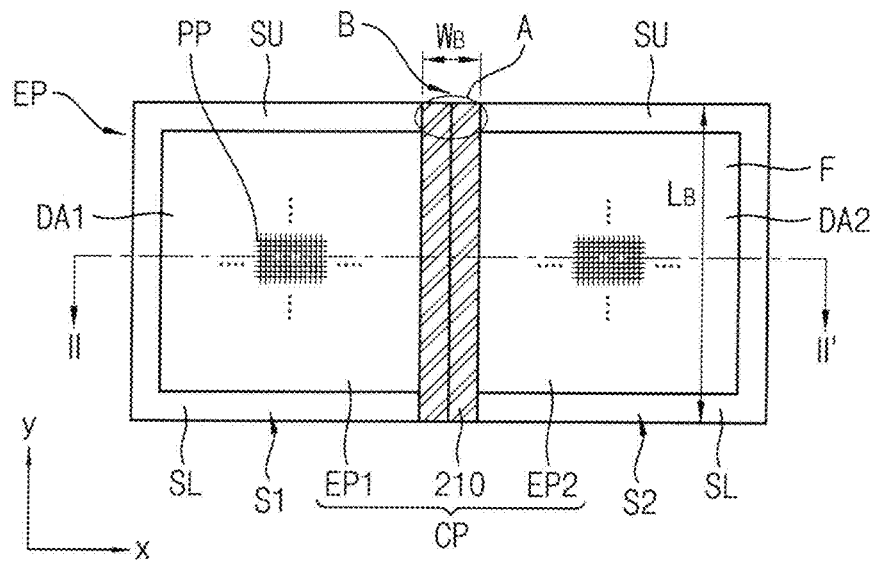
FIG. 3 is a plan view illustrating a coupled panel structure in which a pair of display panels is coupled with each other by the coupling display device shown in FIG. 1.
Figure 4:
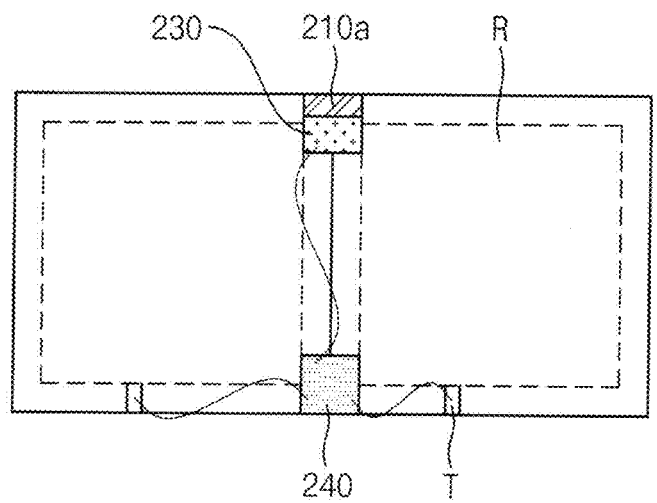
FIG. 4 is a rear view illustrating the coupled panel structure shown in FIG. 3.
Figure 5:
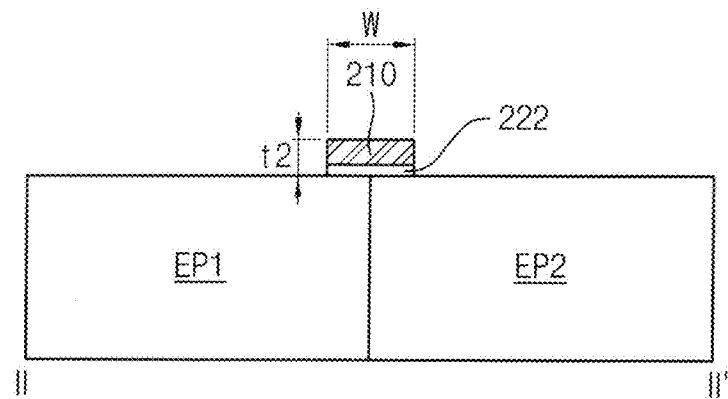
FIG. 5 is a cross-sectional view cut along line II-IF of the coupled panel structure shown in FIG. 3.

FIG. 1 is a perspective view illustrating a coupling display device in accordance with an embodiment of the invention, and FIG. 2 is a cross-sectional view cut along line I-I' of the coupling display device shown in FIG. 1. FIG. 3 is a plan view illustrating a coupled panel structure in which a pair of display panels is coupled with each other by the coupling display device shown in FIG. 1, and FIG. 4 is a rear view illustrating the coupled panel structure shown in FIG. 3. FIG. 5 is a cross-sectional view cut along line II-IF of the coupled panel structure shown in FIG. 3.

Referring to FIGS. 1 to 5, a coupling display device 200 in accordance with an embodiment of the invention may include a boundary display panel 210 arranged between a pair of element display panels EP such that each of the element display panels EP1 and EP2 may have display areas DA1 and DA2, and seam areas S1 and S2 enclosing the display areas DA1 and DA2 and the boundary display panel 210 may cover a pair of the neighboring seam areas S1 and S2 of the element display panels EP1 and EP2, a coupler 220 for coupling the boundary display panel 210 with the element display panels EP1 and EP2 to provide a coupling panel structure CP, a boundary driver 230 arranged at an end portion of the boundary display panel 210 to drive the boundary display panel 210 to operate, and a signal control center 240 arranged at an exterior of the boundary display panel 210 and connected to the boundary driver 230 to drive the coupling panel structure CP to operate in response to a coupling panel driving signal. Hereinafter, the non-display area of each element display panel EP1 and EP2 is referred to as a seam area. In an embodiment, the boundary display panel 210 may be arranged on a pair of neighboring seam areas S1 and S2 of the element display panels EP1 and EP2. In such an embodiment, the seam areas S1 and S2 of the element display panel EP may be covered by the boundary display panel 210.

In an embodiment, a pair of element display panels EP1 and EP2 may be coupled in a first direction x by the boundary display panel 210, as shown in FIG. 3. In such an embodiment, another pair of element display panels may also be coupled to each other in a second direction y substantially perpendicular to the first direction x by the boundary display panel 210.

In one embodiment, for example, the boundary display panel 210 may be coupled to the pair of element display panels or first and second element display panels EP1 and EP2 at the first and second seam areas S1 and S2, such that the first element display panel EP1, the boundary display panel 210 and the second element display panel EP2 may be provided as the coupling panel structure CP. In such an embodiment, the boundary display panel 210 may be provided as an additional display panel for displaying the boundary image data in the coupling panel structure CP.

The first element display panel EP1 and the second element display panel EP2 may be arranged adjacent to each other in a way such that the first seam area S1 may make contact with the second seam area S2. Thus, the first and the second seam areas S1 and S2 may be provided as the boundary area B of the neighboring element display panels EP1 and EP2. Accordingly, the boundary area B may be in a bar shape having a boundary width $W_B$ corresponding to a total size of the first and the second seam areas S1 and S2 and a boundary length Ls corresponding to a width of the element display panel EP.

In an embodiment, where the boundary display panel 210 is arranged on the neighboring seam areas S1 and S2, the boundary display panel 210 may be in a stripe shape extending in the second direction y in the boundary area B. Thus, the boundary display panel 210 may have a panel width Wp corresponding to the boundary width $W_B$ and a panel length Lp longer than the boundary length $L_B$. In such an embodiment, the first and the second seam areas S1 and S2 of the element display panel EP may be covered by the boundary display panel 210 in the boundary area B.

Thus, a lower surface L of the boundary display panel 210 may face a front (or upper) surface F of the element display panel EP and the coupler 220 may be interposed between the lower surface L of the boundary display panel 210 and the front surface F of the element display panel EP. An upper surface U of the boundary display panel 210 may be higher than the front surface F of the element display panel EP and a plurality of the boundary pixels BP may be arranged on the upper surface U of the boundary display panel 210.

In such an embodiment, the boundary display panel 210 may include an emissive panel to thereby minimize a thickness t1 of the boundary display panel 210. In such an embodiment, where the boundary display panel 210 is provided as the emissive panel, a step difference between the front surface F of the element display panel EP and the upper surface U of the boundary display panel 210 may be minimized and the visibility deterioration caused by the step difference may be minimized or effectively prevented.

In such an embodiment, the emissive panel for the boundary display panel 210 may include a light emitting diode ("LED") panel, a micro light emitting diode ("µ-LED") panel, an organic light emitting diode ("OLED") panel, a quantum dot organic light emitting diode ("QD-OLED") panel and a quantum dot nano light emitting diode ("QD nano LED", or "QNED") panel, for example.

In such an embodiment, the boundary display panel 210 may be provided as a flexible panel, and the coupling panel structure CP may be bendable or foldable by a unit of the element display panel EP.

In an embodiment, as illustrated in FIG. 2, the boundary display panel 210 may include a flexible substrate 211 having flexibility sufficient for the bendable and foldable characteristics and rigidity sufficient for a panel shape, a switch layer 212 including a plurality of thin film transistors ("TFT"s) that is arranged on the flexible substrate 211 and selectively switches the driving signals to each of the boundary pixels BP, an emission layer 213 including a plurality of the boundary pixels BP to emit a color light by a unit of the boundary pixel BP in response to the respective driving signal and an encapsulant layer 214 for encapsulating the emission layer 213 from surroundings. In an embodiment, a polarizing plate (not shown) may be further arranged on the encapsulant layer 214 for improving the visibility of the color light of each boundary pixel BP.

In one embodiment, for example, the flexible substrate 211 may include a polyimide ("PI") substrate and the switch layer 212 may include a plurality of P-types metal-oxide-semiconductor ("PMOS") TFT arrays in which P-type dopants may be implanted onto an active region of a semiconductor layer such as a low-temperature polycrystalline silicon ("LTPS") layer. The P-type dopants implanted onto the active region of the LTPS may be provided as the source and drain electrodes of each TFT. A plurality of the boundary pixels BP may be arranged in a matrix shape of the TFTs, so that the boundary pixels BP may be formed into boundary pixel arrays.

A plurality of the TFTs may be arranged on the LTPS layer into a matrix shape and a plurality of the boundary pixels BP may correspond to the plurality of the TFTs, respectively. Thus, each of the boundary pixels BP may be individually controlled by the respective TFT by an active matrix addressing. That is, the boundary image data may be displayed on the upper surface U of the boundary display panel BP by the active matrix addressing to the boundary pixel arrays.

In an embodiment, each of the boundary pixels BP may include three sub-pixels for emitting red, green and blue lights that are referred to as R sub-pixel, G sub-pixel and B sub-pixel. Thus, driving signals to each of the R sub-pixel, the G sub-pixel and the B sub-pixel may be individually controlled independently from one another and the color image may be displayed on the boundary display panel BP just by controlling the signal intensity of the driving signals to the R, G and B sub-pixels. The TFT may be provided to each of the R, G and B sub-pixels and the driving signals to the R, G and B sub-pixels may be individually controlled by the respective TFT, and thus the color image may be sufficiently displayed on the boundary display panel 210.

The boundary pixels BP may be arranged on the emission layer 213. The emission layer 213 may be divided into a plurality of pixel sections that may be separated from each other by a pixel dam. A lower electrode and an emissive source layer may be positioned in each of the pixel sections, so that the boundary pixel BP may be provided at each of the pixel sections of the emission layer 213. In an embodiment, the sub-pixel may be provided at each of the pixel sections and a group of three sub-pixels may constitute a single boundary pixel BA. The emission layer 213 may define a series of the boundary pixels BP in a layer of the pixel arrays. In one embodiment, for example, the emissive source layer may include an organic light emitting material and thus the boundary display panel 210 may be an OLED display panel, but not being limited thereto. Alternatively, any other light emitting materials may also be used for the emissive source layer as long as the boundary display panel 210 is the emissive display panel.

The encapsulant layer 214 may include a composite layer in which an organic layer and an inorganic layer may be alternately formed on the emission layer 213 by a thin film encapsulation ("TFE") process. Thus, the emission layer 213 may be protected from surroundings and thus the dark spot defects may be effectively prevented in the boundary display panel 210.

In an embodiment, as described above, the TFT array and the boundary pixel arrays may be arranged on the flexible substrate 211 such as the PI substrate and the boundary pixels BP may be encapsulated from surroundings by the thin film encapsulant layer 214, such that the boundary display panel 210 may have sufficient flexibility and the thickness t1 of the boundary display panel 210 may be reduced or minimized.

The TFTs of the boundary display panel 210 may be controlled by the boundary driver 230 and the signal control center 240 in a way such that a single image data may be continuously displayed on the boundary display panel 210 as well as on the element display panel EP without substantial seam lines at the boundary areas B. That is, the single image data may be displayed on the coupling panel structure CP as a single screen or a display device and the boundary display panel 210 may function as a portion of the coupling panel structure CP.

The coupler 220 may couple the boundary display panel 210 to the neighboring seam areas S1 and S2 of the element display panels EP1 and EP2. In an embodiment, the boundary display panel 210 may be coupled to the element display panels EP1 and EP2 without being disposed in or through the seam areas S1 and S2, so that the first and the second element display panels EP1 and EP2 may be coupled to each other in a medium of the boundary display panel 210 without forming any hole in or through the seam areas S1 and S2.

In one embodiment, for example, the coupler 220 may include an adhesive 222 interposed between a top surface of the neighboring seam areas S1 and S2 of the element display panels EP1 and EP2 and the lower surface of the boundary display panel 210, as show in FIG. 5. In one embodiment, for example, the adhesive 222 may include a light blocking film for blocking the light from irradiating into the emission layer 213 from surroundings and an optically clear adhesive ("OCA") enclosing the light blocking film and may be provided as a double-sided adhesive that may be adhered to both of the surface of the seam areas S1 and S2 of the element display panel EP and the lower surface L of the boundary display panel 210. In an alternative embodiment, the coupler 220 may include a semi-hardened optically transparent resin in place of the OCA without the light blocking film by which the boundary display panel 210 and the element display panel EP may be directly bonded to each other.

In such an embodiment, the boundary display panel 210 may be protruded from the neighboring seam areas S1 and S2 and the first and the second element display panels EP1 and EP2 may be coupled or combined to each other by the boundary display panel 210. As the boundary display panel 210 may be coupled to the seam areas S1 and S2 by the coupler 220, the upper surface U of the boundary display panel 210 may be spaced apart from the front surface F of the element display panels EP1 and EP2 by a coupling thickness t2 in the boundary area B.

The coupling thickness t2 may be controlled in a way such that the step difference between the front surface F and the upper surface U may be minimized and the visibility deterioration of the coupling panel structure CP caused by the step difference may be minimized. In an embodiment, where the boundary display panel 210 is manufactured by an OLED panel manufacturing processes and the coupler 220 may be formed by coating an adhesive on the boundary display panel 210, the coupling thickness t2 may be controlled by changing the thickness of the coupler 220.

In one embodiment, for example, the thickness of the adhesive 222 may be in a range of about 50 μm to about 60 μm and the coupling thickness t2 of the boundary display panel 210 and the adhesive 222 may be in a range of about 120 μm to about 150 μm in the boundary area B. Thus, the boundary display panel 210 and the adhesive 222 may be protruded from the seam areas S1 and S2 of the element display panels EP with a thickness in a range of about 120 μm to about 150 μm.

In such an embodiment, if the coupling thickness t2 is less than about 120 μm, the thickness of the adhesive 222 may be so small that the boundary display panel 210 may not be sufficiently adhered to the element display panel EP. In such an embodiment, if the coupling thickness t2 is greater than about 150 μm, the thickness of the adhesive 222 may be so great that the step difference between the boundary display panel 210 and the element display panel EP may be excessively high and thus the visibility quality of the coupling panel structure CP may be deteriorated due to the high step difference. Accordingly, in such an embodiment, the coupling thickness t2 of the boundary display panel 210 and the element display panel EP may be in a range of about 120 μm to about 150 μm in the boundary area B.

In an embodiment, the panel length Lp of the boundary display panel 210 may be longer than the boundary length $L_B$ of the boundary area B. In such an embodiment, the boundary display panel 210 may be provided as the flexible panel, and an end portion of the boundary display panel 210 may be bent or folded toward the rear surface R of the element display panel EP.

In such an embodiment, as shown in FIG. 4, the end portion of the boundary display panel 210 may be bent over toward the rear portion of the element display panel EP and a bent portion 210a of the boundary display panel 210 may be bonded to the rear surface R of the element display panel EP. In such an embodiment, the coupler 220 or the adhesive 222 may also be bent together with the bent portion 210a and may be interposed between the bent portion 210a and the rear surface R of the element display panel EP. Accordingly, the boundary display panel 210 may be further adhered to the rear surface R as well as the front surface F of the element display panel EP to thereby reinforce the adherence force between the boundary display panel 210 and the element display panel EP.

In an embodiment, the boundary driver 230 may be detachably combined to the bent portion 210a of the boundary display panel 210 and may be secured to the rear portion of the element display panel EP, which will be described in detail hereinafter.

In an alternative embodiment, the coupler 220 may include a protruding member 224 that may be protruded from the lower surface L of the bent portion 210a of the boundary display panel 210 and may be inserted into the rear surface R of the element display panel EP.

Figure 6:
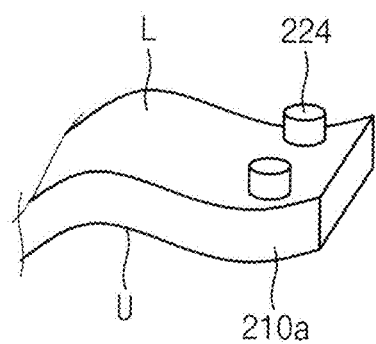
FIG. 6 is a perspective view illustrating an alternative embodiment of the coupler of the coupling panel structure shown in FIG. 1.

FIG. 6 is a perspective view illustrating an alternative embodiment of the coupler of the coupling panel structure shown in FIG. 1.

Referring to FIG. 6, an embodiment of the coupler 220 may include at least a protruding member 224 that may be protruded from the lower surface L of the bent portion 210a of the boundary display panel 210.

In one embodiment, for example, the protruding member 224 may include a circular or a polygonal cylinder protruded from the lower surface L of the bent portion 210a and a receiver (not shown) may be defined in the rear surface R of the element display panel EP. Thus, the protruding member 224 may be inserted into the receiver of the element display panel EP and thus the boundary display panel 210 may be secured to the rear surface R of the element display panel EP. In an embodiment, a plurality of protruding members 224 may be provided and may be evenly arranged on both of the first and the second element display panels EP1 and EP2. In such an embodiment, a plurality of receivers may also be evenly distributed on the rear surfaces R of the first and the second element display panels EP1 and EP2 in a way such that the receivers and the protruding members 224 may be in a one-to-one correspondence with each other.

In another alternative embodiment, the protruding member 224 may include a magnetic body and the rear surface R of the element display panel EP may be covered by a metal plate. Thus, the bent portion 210a of the boundary display panel 210 may be secured to the rear surface R by a magnetic force.

In still another alternative embodiment, the bent portion 210a may be secured to a frame of a tiled display device including the coupling panel structure CP. In such an embodiment, the boundary display panel 210 may be adhered to the front surface F of the element display panel EP at the seam areas S1 and S2 and the bent portion 210a may be further secured to the frame of the tiled display device. Thus, the adherence force between the boundary display panel 210 and the element display panel EP may be reinforced by the bent portion 210a.

In another alternative embodiment, the coupler 220 may further include an aligning groove 226 for aligning the panel pixels PP of the element display panel EP and the boundary pixels BP of the boundary display panel 210 in way such that the panel pixels PP and the boundary pixels BP may be aligned into a single pixel row in the first direction x.

Figure 7:
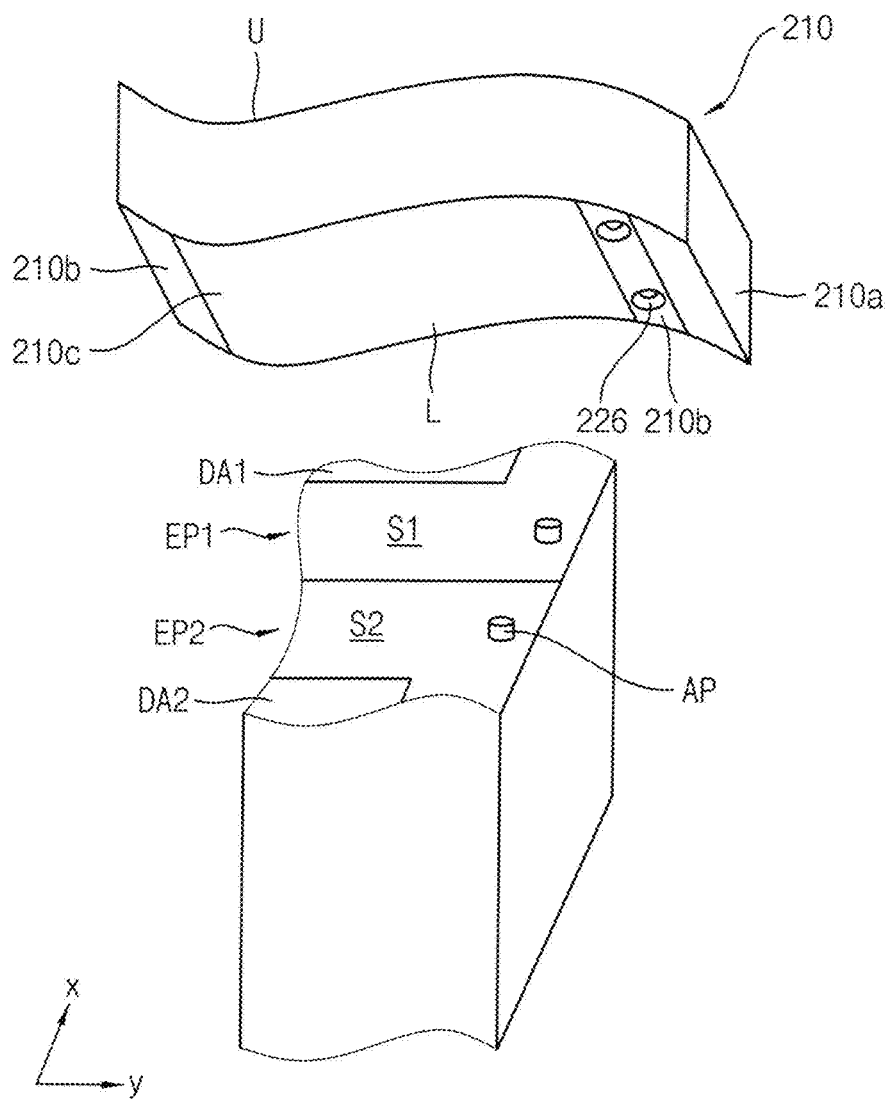
FIG. 7 is a perspective view illustrating another alternative embodiment of the coupler of the coupling panel structure shown in FIG. 1.

FIG. 7 is a perspective view illustrating another alternative embodiment of the coupler of the coupling panel structure shown in FIG. 1. FIG. 7 is an enlarged view corresponding to the portion A shown in FIG. 3.

Referring to FIGS. 3 and 7, a plurality of the panel pixels PP may be arranged in the display areas DA1 and DA2 of the element display panels EP1 and EP2, and the display areas DA1 and DA2 may be enclosed by the seam areas S1 and S2 at the peripheral portion of the element display panels EP1 and EP2. Thus, an upper seam area SU may be arranged at an upper portion of the boundary area B and a lower seam area SL may be arranged at a lower portion of the boundary area B, as shown in FIG. 3. The upper and lower seam areas SU and SL may be opposite to each other in the second direction y.

The boundary display panel 210 may be divided into a boundary display area 210c in which a plurality of the boundary pixels BP may be arranged in a matrix shape and a boundary non-display area 210b having no boundary pixels and close to the upper and lower seam areas SU and SL. That is, the boundary non-display area 210b may be provided at upper and lower end portions of the boundary display panel 210 in correspondence with the upper and lower seam areas SU and SL and the boundary display area 210c may be provided between the upper and lower end portions of the boundary display panel 210 and between the display areas DA1 and DA2 of the element display panels EP1 and EP2. The boundary non-display area 210b may be connected to the bent portion 210a of the boundary display panel 210.

The aligning groove 226 may be defined in the lower surface L of the boundary non-display area 210b with a predetermined depth, and an aligning protrude AP may be defined or arranged on the upper seam area SU and/or the lower seam area SL in correspondence with the aligning groove 226. The boundary display panel 210 may be coupled to the element display panel EP at the boundary area B in a way such that the aligning groove 226 may receive the corresponding aligning protrude AP.

In such an embodiment, since no panel pixels PP may be arranged on the upper and the lower seam areas SU and SL and no boundary pixels BP may be arranged on the boundary non-display area 210b, the aligning protrude AP and the aligning groove 226 may be provided with the element display panel EP and the boundary display panel 210, respectively, without any substantial deterioration of the visibility of the coupling panel structure CP.

In an embodiment, the insertion of the aligning protrude AP into the aligning groove 226 may allow the boundary display panel 210 to be coupled to the element display panel EP in a way that a pixel row of the panel pixels PP and a pixel row of boundary pixels BP may be aligned with each other in a line along the first direction x, thereby forming a same pixel row of the coupling panel structure CP extending in the first direction x. Thus, the pixel array of the panel pixels PP and the pixel array of the boundary pixels BP may be arranged in a same matrix shape by the combination of the aligning protrude AP and the aligning groove 262 when the boundary display panel 210 is coupled to the seam areas S1 and S2 of the element display panel EP.

The size of the boundary non-display area 210b may be variously determined based on the size of the upper and lower seam areas SU and SL. in an embodiment, even when the boundary pixels BP may be arranged on the boundary non-display area 210b, the boundary pixel BP in the boundary non-display area 210b may be inactive or may be a dummy pixel.

Accordingly, the panel pixels PP and the boundary pixels BP may be arranged into a single pixel array of the coupling panel structure CP due to the aligning groove 226 and the aligning protrude AP that may be provided in the boundary non-display area 210b and the upper and lower seam areas SU and SL, respectively.

In an embodiment discloses, a pair of the aligning protrudes AP may be provided with each of the first and the second element display panel EP1 and EP 2, respectively, and a pair of the aligning grooves 226 may be provided with the coupling panel structure CP in correspondence with the pair of the aligning protrudes AP, as shown in FIG. 7, but not being limited thereto. Alternatively, the number and the positions of the aligning protrudes AP may be variously modified as long as the panel pixels PP and the boundary pixels BP are effectively aligned with each other in the first direction x, and the number and positions of the aligning grooves 226 may also be variously modified based on the modification of the aligning protrude AP.

In one embodiment, for example, the boundary driver 230 may be connected to the end portion of the boundary display panel 210 and may operate the boundary pixels BP independently of the panel pixels PP. A boundary driving signal may be applied to the boundary pixels BP by the boundary driver 230 and the boundary image may be displayed on the boundary display panel 210.

In one embodiment, for example, the boundary driver 230 may include a drive chip for applying data signals and scan signals to the boundary pixels BP and a timing controller for determining time orders of the data signals and the scan signals. Each of the boundary pixels BP may be operated by a respective TFT and may be activated by an active matrix addressing scheme. That is, the boundary image may be displayed on the boundary display panel 210 by the active matrix addressing scheme.

The boundary driver 230 may include a boundary display drive integrated circuit ("IC") ("DDI") package that may be detachably secured to the bent portion 210a of the boundary display panel 210. The boundary DDI package may be provided as a mobile DDI ("MDI") package or a panel DDI ("PDI") package according a display type of the element display panels EP.

In one embodiment, for example, where the bent portion 210a of the boundary display panel 210 is bent over the rear surface R of the element display panels EP1 and EP2, the boundary DDI package may be connected to the bent portion 210a at the rear portion of the element display panels EP1 and EP2. In an alternative embodiment, where the end portion of the boundary display panel 210 is positioned on the upper/lower seam area SU or SL, the boundary DDI package may be connected to the end portion of the boundary display panel 210 on the upper/lower seam area SU or SL and may be bent over the rear surface R of the element display panels EP1 and EP2. In such an embodiment, the boundary DDI package may include a flexible circuit board on which the drive IC chip may be mounted. Thus, the boundary DDI package may be bent over and secured to the rear surface R of the element display panels EP1 and EP2.

In one embodiment, for example, the signal control center 240 may be positioned apart from the boundary display panel 210 and the element display panels EP1 and EP2 and may be connected to the boundary driver 230 as well as the panel drivers of the of element display panels EP1 and EP2. The signal control center 240 may receive an image data from an electronic system and may convert the image data into a conversion image data for the coupling panel structure CP. The conversion image data may be applied to the coupling panel structure CP under the control of the signal control center 240 and may be displayed on the coupling panel structure CP. That is, the conversion image data may be displayed on the coupling panel structure CP by the panel pixels PP and the boundary pixels BP under the control of the signal control center 240 continuously across the first element display panels EP1, the boundary display panel BP and the second element display panel EP2.

In an embodiment, the signal control center 240 may be arranged on the rear surfaced R of the element display panel EP and be connected to the boundary driver 230 and the panel drivers for driving the element display panels EP1 and EP2. The position and configurations of the signal control center 240 may be variously modified as long as the signal control center 240 is effectively connected to the boundary driver 230 and the panel drivers. In one embodiment, for example, when the signal control center 240 may include a wireless access terminal, the signal control center 240 may be located at any positions where the boundary driver 230 and the panel drivers may be communicated with the signal control center 240 by the wireless access terminal.

Figure 8:
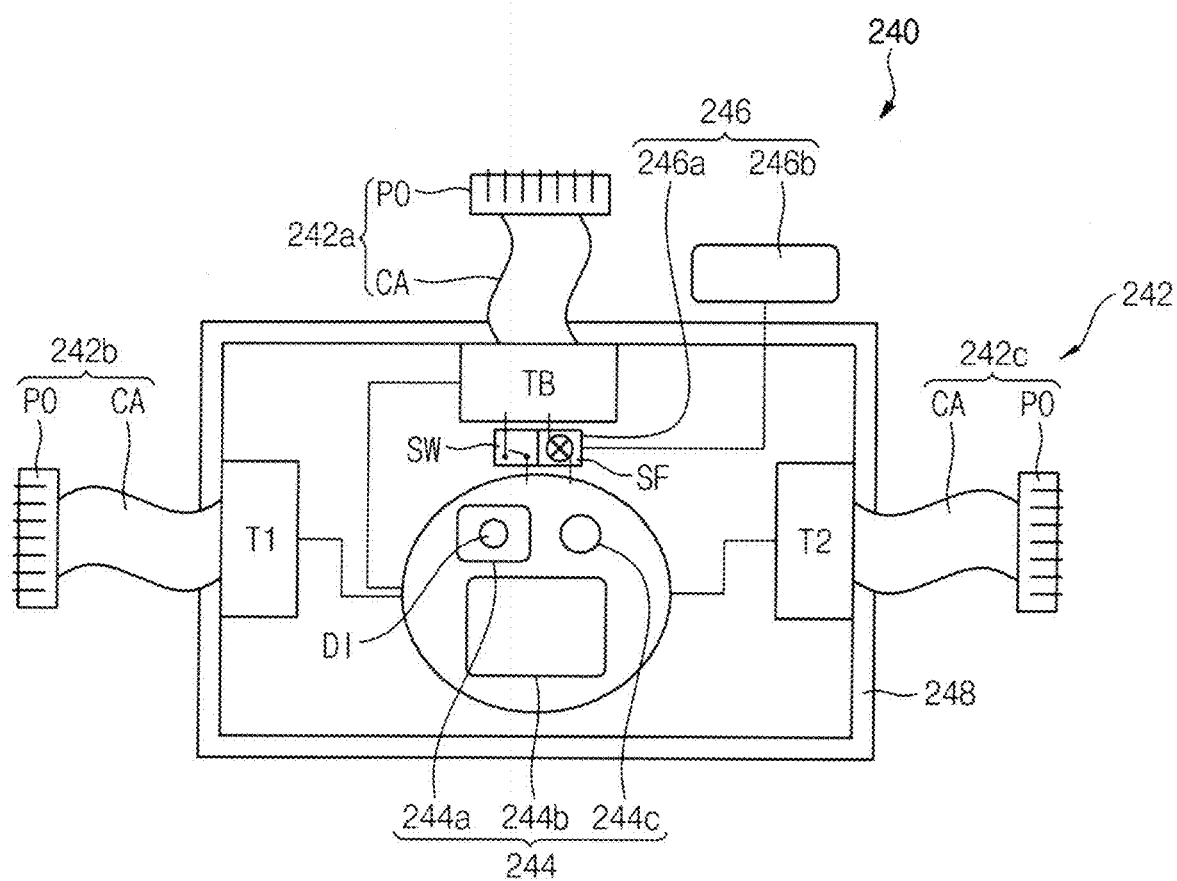
FIG. 8 is a structural view illustrating the signal control center 240 of the coupling panel structure shown in FIG. 1 in accordance with an embodiment of the invention.

FIG. 8 is a structural view illustrating the signal control center 240 of the coupling panel structure shown in FIG. 1 in accordance with an embodiment of the invention.

Referring to FIG. 8, an embodiment of the signal control center 240 may include a connector 242 connected to the boundary driver 230 and the panel drivers for driving the element display panels EP1 and EP2, a signal processor 244 for processing a panel driving signal for driving at least one of the element display panels EP1 and EP2 to generate the coupling panel driving signal and applying the coupling panel driving signal to the coupling panel structure CP such that the coupling panel structure CP is operated in response to the coupling panel driving signal, a mode selector 246 for selecting an operation mode of the coupling panel structure CP by selectively connecting the signal processor 244 and the boundary driver 230 and a housing 248 enclosing the signal processor 244 and onto which the mode selector 246 may be secured.

In one embodiment, for example, the connector 242 may include a plurality of terminals TB, T1 and T2 that may be arranged at connection areas of the housing 248, respectively, a plurality of signal cables CA extending out of the housing 248 from the terminals TB, T1 and T2 to transfer the panel driving signal and the converted driving signal therethrough and a plurality of ports PO connected to the signal cables CA and to combine the boundary driver 230 and the panel drivers of the first and second element display panels EP1 and EP2 with each other.

A boundary terminal TB may be arranged at a boundary connection area of the housing 248 and a boundary connector 242a may be connected to the boundary terminal TB. The boundary connector 242a may be connected to the boundary display panel 210. In addition, first and second terminals T1 and T2 may be arranged at first and second connection areas of the housing 248 and first and second connectors 242b and 242c may be connected to the first and second terminals T1 and T2, respectively. The first and second connectors 242b and 242c may be connected to the first element display panel EP1 and the second element display panel EP2, respectively.

The panel driver of the element display panel EP may include a conventional DDI package and the panel driving signal may be applied to the panel pixels PP under the control of the DDI package. Thus, the image data may be displayed on the element display panel EP in response to the panel driving signal. The DDI package may include a drive chip for applying the panel driving signals having data signals and scan signals to the panel pixels PP and a timing controller for determining time orders of the data signals and the scan signals. The DDI package may include a mobile DDI for controlling signals applied to a relatively small-sized panel such as a smart phone, a smart watch and a wearable device and a panel DDI for controlling signals applied to a relatively large-sized panel such as a television and a large-sized screen.

The boundary connector 242a may be connected to the DDI package of the boundary driver 230, and the first and second connectors 242b and 242c may be connected to the panel drivers. Thus, the image data transferred to at least one of the element display panels EP1 and EP2 may be detected by the signal control center 240 via the first and/or connectors 242b and 242c and the conversion image data generated from the signal processor 244 may be applied to the boundary driver 230 via the boundary connector 242a.

The panel driving signals for driving the element display panels EP1 and EP2 may be converted to the converted a coupling panel driving signals for driving the coupling panel structure CP by the signal processor 244. Thus, the data signals that may be applied to a pixel row of at least one of the element display panels EP1 and EP2 may be converted into converted data signals that may be applied to a pixel row of the coupling panel structure CP. In addition, the scan signals activating the pixel row of at least one of the element display panels EP1 and EP2 may be converted into converted scan signals for activating the pixel row of the coupling panel structure CP. The converted data signals and the converted scan signals may constitute the coupling panel driving signals and the coupling panel structure CP may be operated in response to the converted driving signals by the signal processor 244.

In one embodiment, for example, the signal processor 244 may include a pixel converter 244a, a coupling panel driver 244b and a gradation operator 244c.

The pixel converter 244a may detect panel pixel arrays of the first and the second element display panel EP1 and EP2 and a boundary pixel array of the boundary display panel 210 and may generate a coupling pixel array of the coupling panel structure CP from the panel pixel arrays and the boundary pixel array. The pixel converter 244a may detect the information of the panel pixel arrays and the boundary pixel array from the panel drivers and the boundary driver 230, respectively, and may combine the detected panel pixel arrays and the boundary pixel array with each other. In an embodiment, the panel pixel arrays and the boundary pixel array may be added in the first direction x and a new pixel array may be generated as the coupling pixel array.

In one embodiment, for example, if the first and the second element display panels EP1 and EP2 may have the panel pixel array of 10×10 matrix having 10 pixel rows and 10 pixel columns, respectively, and the boundary display panel 210 may have boundary pixel array of 10×3 matrix having 10 pixel rows and 3 pixel columns, the pixel converter 244a may generate the coupling pixel array of 10×23 matrix having pixel rows and 23 pixel columns by the pixel conversion. That is, a pair of the element display panels EP1 and EP2 having the panel pixel array of 10×10 matrix, respectively, and the boundary display panel 210 having the boundary pixel array of 10×3 matrix may be coupled to the coupling panel structure CP having the coupling pixel array of 10×23 matrix.

The coupling panel driver 244b may convert the data signals and the scan signals of the panel driving signal into the converted data signals and the converted scan signals of the coupling panel driving signal, and may apply the converted data signals and the converted scan signals to the boundary display panel 210 and the element display panel EP in view of the coupling pixel array. Thus, the data signals and the scan signals for the 10×10 pixel array may be converted into the converted data signals and the converted scan signals for the 23×10 pixel array and may be applied to the coupling panel structure CP.

When the panel driving signal is applied to the coupling panel structure CP by an external electronic system, the data signals and the scan signals of the panel driving signal may be transferred to the signal processor 244 and may be converted into the converted data signals and the converted scan signals by the coupling panel driver 244b. Then, the converted data signals and the converted scan signals may be applied to the coupling panel structure CP on a basis of the coupling panel pixel array by the coupling panel driver 244b.

In an embodiment where the signal control center 240 is connected to the panel drivers and the boundary driver 230, the coupling panel driving signals may be simultaneously applied to the panel drivers and the boundary driver 230. Thus, the coupling panel structure CP may function as a single display panel with the coupling pixel array, and the image data may be displayed on the coupling panel structure CP in response to the coupling panel driving signals.

In an embodiment, the coupling panel driver 244b may include a data interpolation unit DI for preventing image deterioration caused by the pixel increase to the coupling pixel array from the panel pixel array. In one embodiment, for example, as the panel driving signal may be adapted to display the image data on the 10×10 pixel array, the image data of the panel driving signals may be deteriorated when the converted data signals may be applied to the coupling panel structure CP having the 23×10 coupling pixel array. Thus, the converted data signals need be interpolated for minimizing the image deterioration in the coupling panel structure CP by the data interpolation unit DI.

In one embodiment, for example, when the image data for the 10×0 pixel array may be displayed by using the 23×10 coupling pixel array, some pixels of the coupling pixel array may have no image data (no image pixel) in the first direction x. In such a case, the image data for the no image pixel may be inferred from the image data of a pair of image pixels neighboring the no image pixel in the first direction x by a data interpolation. The image pixel denotes a pixel of the coupling panel structure CP to which an image data may be applied. That is, the image data of the no image pixel may be inferred from the image data of the neighboring image pixels by the data interpolation. In one embodiment, for example, the image data for the no image pixel may be inferred by a linear interpolation technique. Alternatively, various data interpolation technique may be used for the image data interference of the no image pixel of the coupling pixel array according to the configurations of the coupling pane structure CP.

In one embodiment, for example, the mode selector 246 may automatically or manually select the operation mode of the coupling panel structure CP.

In an embodiment, the mode selector 246 may include a signal regulator 246a for regulating the signal transfer between the signal processor 244 and the boundary driver 230, and a user interface 246b for controlling the signal regulator 246a. Thus, the boundary driver 230 may be selectively activated by the mode selector 246 and the coupling panel structure CP may be selectively operated in a single panel mode and a multi panel mode according to the operation of the mode selector 246. The element display panels EP may function integrally as a single display panel in the single panel mode and may function individually as a pair of independent display panels in the multi panel mode.

The signal regulator 246a may be arranged between the coupling panel driver 244b and the boundary driver 230 and may regulate the signals that may be applied to the boundary driver 230. In one embodiment, for example, the signal regulator 246a may include a signal filter SF for filtering the coupling panel driving signal applied to the boundary driver 230 and a switch device SW for selectively connecting or disconnecting the coupling panel driver 244b with the boundary driver 230.

In such an embodiment, when the coupling panel driving signal are wholly applied to the boundary driver 230 without any filtering of signals from the coupling panel driving signal, the image data may be displayed on the whole coupling panel structure CP and the coupling panel structure CP may be provided as a single display panel for a tiled display device. Thus, a pair of the element display panels EP1 and EP2 and the boundary display panel 210 may be systematically controlled as a part of the coupling panel structure CP by the signal processor 244, and the coupling panel structure CP may function in the single panel mode.

In such an embodiment, when some of the signals are filtered from the coupling panel driving signal by the signal filter SF and the filtered coupling panel driving signal may be applied to the boundary display panel 210, no image data may be displayed on the boundary display panel 210.

Thus, the image data may be displayed on the element display panels EP1 and EP2 in response to the filtered coupling panel driving signal. In such a case, additional driving signals may be applied to the boundary display panel 210 by the coupling panel driver 244b in place of the coupling panel driving signal.

In an embodiment, when the coupling panel driving signals are not applied to the boundary display panel 210, the coupling panel driver 244b may control the panel driving signals to be applied to the first and the second element display panels EP1 and EP2 individually and independently from each other. That is, the element display panels EP1 and EP2 may not function as a part of the coupling panel structure CP and may function as a pair of individual panels. That is, the coupling panel structure CP may be operated in the multi panel mode.

In an embodiment, when the coupling panel structure CP operates in the multi panel mode, the signal processor 244 may drive the boundary driver 230 in a way such that a whole gradation of the boundary display panel 210 may become close or similar to edge gradations of the element display panels EP symmetric with each other with respect to the boundary display panel 210.

Thus, the gradation operator 244c may be provided with the signal processor 244. The gradation operator 244c may obtain the gradation of the boundary pixels as a mean value of the gradation data of a pair of the panel pixels that are closest to the boundary display panel 210 and opposite to each other in the first direction x with respect to the boundary display panel 210. Thus, the gradation of the boundary pixels BP may be changed into the mean gradation of the leftmost and rightmost panel pixels PP in the first direction x that is a row direction of the boundary pixel array, to thereby improve the visibility of image data on the first and the second display area DA1 and DA2, respectively.

In such an embodiment, when the coupling panel structure CP operates in the multi panel mode, the first and the second element display panels EP1 and EP2 may function as a mirroring panel to each other in a way such that the image data displayed on the first element display panel EP1 may be a mirror image of the image data displayed on the second element display panel EP2 and the image data displayed on the second element display panel EP2 may be a mirror image of the image data displayed on the first element display panel EP1.

In such a case, no image data may be displayed on the boundary display panel 210 and the gradation of the boundary display panel 210 may be controlled by the gradation operator 244c in a way such that the visibility of image data on the first and the second display area DA1 and DA2 may be effectively improved.

The operation mode of the coupling panel structure CP may also be controlled by the switch device SW. The switch device SW may selectively connect or disconnect the coupling panel driver 244b with the boundary driver 230, and the coupling panel structure CP may be operated in the single panel mode or the multi panel mode by the switch device SW. In an embodiment, when the boundary driver 230 may be disconnected from the coupling panel driver 244b, the boundary display panel 210 may be out of the control of the signal processor 244 and the coupling panel structure CP may be operated without the boundary display panel 210. In such a case, the boundary display panel 210 may function just as a coupling member for coupling the first and the second element display panels EP1 and EP2.

The user interface 246b may be connected to the signal regulator 246a and may give instructions on the operation mode of the coupling panel structure CP to the signal regulator 246a according to the user's instruction. Thus, the coupling panel structure CP may be operated in one of the single panel mode and the multi panel mode by the operating instructions of the user interface 246b. The user interface 246b may include various control interfaces such as a touch screen as long as the control interfaces may be electrically connected to the signal regulator 246a.

In one embodiment, for example, the housing 248 may include a cubic structure in which the boundary terminal TB, the first and the second terminals T1 and T2, the signal processor 244 and the signal regulator 246a may be arranged and may define an exterior of the signal control center 240. Thus, the housing 248 may have such a sufficient rigidity and strength such that the boundary terminal TB, the first and the second terminals T1 and T2, the signal processor 244 and the signal regulator 246a may be protected from surroundings and the user interface 246b may be arranged on an outer surface of the housing 248. The user interface 246b may be positioned independently of the housing 248 when the user interface 246b is connected to the signal regulator 246a by a wireless communication device such as a Bluetooth device.

According to embodiments of the flexible coupling display device 200, a pair of the element display panels EP1 and EP2 may be coupled with the flexible coupling display device 200 at the neighboring seam areas S1 and S2 thereof. Thus, the element display panels EP1 and EP2 and the boundary display panel 210 may be formed into the coupling panel structure CP operated by a single coupling panel driving signal. Therefore, the pair of the element display panels EP1 and EP2 may be formed into a seamless tiled display device without any damages to the neighboring element display panels by the coupling display device 200.

In such embodiments, as the boundary display panel 210 may be positioned at the boundary area B between the element display panels EP1 and EP2, the pixel number of the coupling panel structure CP may easily increase as many as the pixel number of the boundary display panel 210. Thus, the pixel number of the tiled display device or a large-scaled multi-screen apparatus may be easily increase just by coupling the element display panels EP and the coupling display device 200.

In such embodiments, the operation mode of the coupling panel structure CP may be easily selected between the single panel mode and the multi panel mode just by the operation of the mode selector 246 according to the user's instruction, to thereby improve the use of ease and the facility of the tiled display device.

Figure 9:
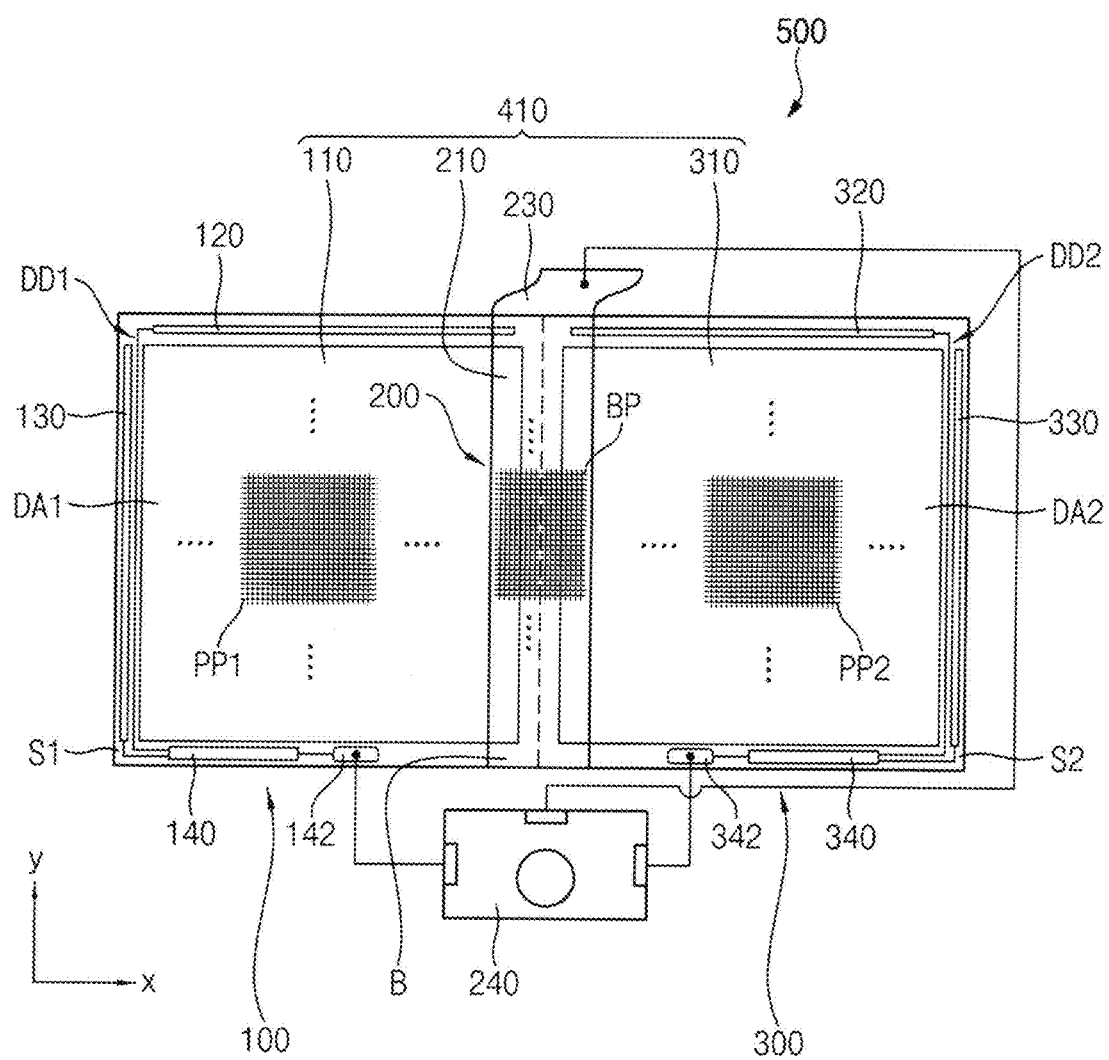
FIG. 9 is a structural view illustrating a tiled display device including the coupling display device shown in FIG. 1 in accordance with an embodiment of the invention.

FIG. 9 is a structural view illustrating a tiled display device including the coupling display device shown in FIG. 1 in accordance with an embodiment of the invention.

Referring to FIG. 9, a tiled display device 500 in accordance with an embodiment of the invention may include at least a pair of element display devices 100 and 300 including panel drivers DD1 and DD2 and element display panels 110 and 310 having display areas DA1 and DA2 and seam areas S1 and S2 enclosing the display areas DA1 and DA2, respectively, and on which the panel drivers DD1 and DD2 may be arranged and a coupling display device 200 coupling the element display devices 100 and 300 at neighboring seam areas S1 and S2 of the element display panels 110 and 310 in such a configuration that the seam areas S1 and S2 of the element display panels 110 and 310 may be covered by the coupling display device 200.

In the embodiments, a pair of first and second element display devices 100 and 300 may be coupled into the tiled display device 500 by a single coupling display device 200. However, a plurality of the element display devices may also be coupled into the tiled display device by a plurality of the coupling display device 200.

For example, the first and the second display devices 100 and 300 may be arranged side by side in such a configuration that the neighboring seam areas S1 and S2 may come close to each other and the coupling display deice 200 may be coupled to the first and the second display devices 100 and 300. Particularly, the neighboring seam areas S1 and S2 may be covered with the coupling display device 200.

The first display device 100 may include a first element display panel 110 having a first display area DA1 and a first seam area S1 enclosing the first display area DA1 at a peripheral portion of the first element display panel 110. A plurality of first panel pixels PP1 may be arranged in the first display area DA1 as a first panel pixel array and the image data may be displayed at the first display area DA1 of the first element display panel 110. A first panel driver DD1 may be arranged on the first seam area S1 and may drive the first panel pixels PP1 to display the image data.

The first element display panel 110 may include a rigid panel or a flexible panel and the first pixel array may be provided as an active matrix array having a plurality of thin film transistors (TFT) corresponding to the first panel pixels PP1 by one to one. Each first panel pixel PP1 may be driven by the corresponding thin film transistor (TFT).

The first panel driver DD1 may include a first data driver 120 for transferring data signals to the TFTs, a first scan driver 130 for applying scan signals to the TFTs and a first timing controller 140 for generating timing signals for synchronizing the data signals and the scan signals. The first data driver 120 and the first scan driver 130 may be arranged on the first seam area S1 of the first element display panel 110.

When the panel driving signal may be applied to the first display device 100, the image data of the panel driving signal may be grouped into a unit of data row and the image data of the data row may be simultaneously transferred to the first panel pixels PP1 by the first data driver 120. A plurality of the data rows may be sequentially and continuously transferred to the first panel pixels PP1 by the first data driver 120. A horizontal series of first panel pixels PP1 in the first panel pixel array may be selected as a pixel row by the first scan driver 130. Thus, the first panel pixels PP1 may be grouped into a plurality of pixel rows by the first scan driver 130. The first timing controller 140 may be applied the timing signals to the first data driver 120 and the first scan driver 130 in such a way that the data signals of the data row may be applied to the corresponding pixel row. Therefore, each of the first panel pixels PP1 may be activated in response to the data signal applied thereto and the image data may be displayed on the first display area DA1 of the first element display panel 110.

Accordingly, when the panel driving signal may be applied to the first display device 100, the first display area DA1 may become a bright portion and the first seam area S1 may become a dark portion around the bright portion.

In the same way, the second display device 300 may include a second element display panel 310 having a second display area DA2 and a second seam area S2 enclosing the second display area DA2 at a peripheral portion of the second element display panel 310. A plurality of second panel pixels PP2 may be arranged in the second display area DA2 as a second panel pixel array and the image data may be displayed at the second display area DA2 of the second element display panel 310. A second panel driver DD2 may be arranged on the second seam area S2 and may drive the second panel pixels PP2 to display the image data.

The second element display panel 310 may include a rigid panel or a flexible panel and the second pixel array may also be provided as an active matrix array having a plurality of thin film transistors (TFT) corresponding to the second panel pixels PP2 by one to one. Each second panel pixel PP2 may be driven by the corresponding thin film transistor (TFT).

The second panel driver DD2 may include a second data driver 320 for transferring data signals to the TFTs, a second scan driver 330 for applying scan signals to the TFTs and a second timing controller 340 for generating timing signals for synchronizing the data signals and the scan signals. The second data driver 320 and the second scan driver 330 may be arranged on the second seam area S2 of the second element display panel 310.

The second element display panel 310 and the second panel driver DD2 may have substantially the same structures as the first element display panel 110 and the first panel driver DD1, so that any further detailed descriptions on the second element display panel 310 and the second panel driver DD2 will be omitted.

For example, the first and the second element display panels 110 and 310 may include any one of a liquid crystal display (LCD) panel, a plasma display panel (PDP), a rigid organic light emitting diode (OLED) display panel, a quantum nano-cell emitting diode (QNED) display panel, a quantum dot (QD) micro-LED display panel and a micro-LED display panel.

The first timing controller 140 may be arranged on the first seam area S1 and may be connected outwards via a first control terminal 142 that may be arranged on the first seam area S1 around the first timing controller 140. In the same way, the second timing controller 340 may be arranged on the second seam area S2 and may be connected outwards via a second control terminal 342 that may be arranged on the second seam area S2 around the second timing controller 340.

The first seam area S1 of the first element display panel 110 may be close to the second seam area S2 of the second element display panel 310 between the first element display panel 110 and the second element display panel 310. Hereinafter, the neighboring first and second seam areas S1 and S2 may be often referred to as boundary area B of the first and the second display devices 100 and 300. Thus, the size of the dark portion may be enlarged at the boundary area B between the first element display panel 110 and the second element display panel 310, to thereby reduce the display quality of the tiled display device 500.

For that reason, the coupling display device 200 may be arranged on the boundary area B between the first element display panel 110 and the second element display panel 310 in such a configuration that the first and the second element display panels 110 and 310 may be coupled to the coupling display device 200 and the first and the second seam areas S1 and S2 may be covered by the coupling display device 200 between the first and the second element display panels 110 and 310. Therefore, the enlarged dark portion of the first and the second seam areas S1 and S2 may be eliminated from the boundary area B.

The coupling display device 200 may be coupled to both of the first and the second element display panels 110 and 310 at the boundary area B, and thus the first and the second element display panels 110 and 310 may be coupled to each other in a medium of the coupling display device 200. In addition, as the coupling display device 200 may include an additional display panel (i.e., boundary display panel 210), the gradation of the coupling display device 200 may be adjusted regardless of the first and the second element display panels 110 and 310 and an image data may also be displayed on the coupling display device 200. Therefore, the size of the display area of the tiled display device 500 may be enlarged as large as the size of boundary area B as well as the enlarged dark portion may be eliminated from the tiled display device 500 by the coupling display device 200.

Particularly, the coupling display device 200 may be coupled to the first and the second seam areas S1 and S2 by using the coupler without any damages to the first and the second element display panels 110 and 310, to thereby improve the reliability and stability of the tiled display device 500.

For example, the coupling display device 200 may include a boundary display panel 210 arranged on the neighboring seam areas S1 and S2 of the element display panels 110 and 310, a coupler 220 coupling the boundary display panel 210 with the element display panels 110 and 310 to provide a coupling panel structure 410, a boundary driver 230 arranged at an end portion of the boundary display panel 210 to drive the boundary display panel 210 to operate, and a signal control center 240 arranged at an exterior of the boundary display panel 210 and connected to the boundary driver 230, the first panel driver DD1 and the second panel driver DD2 in such a configuration that the coupling panel structure 410 may be operated in response to a coupling panel driving signal that is converted from the panel driving signal.

The pixel arrays of the first panel pixels PP1 and the second panel pixels PP2 may be converted to the coupling pixel array for the coupling panel structure 410 by the signal control center 240 and the panel driving signal may also be converted into the coupling panel driving signal in view of the coupling pixel array by the signal control center 240.

As the signal control center 240 may be connected to the boundary driver 230 and the first and the second panel drivers DD1 and DD2, the pixel conversion and the signal conversion may be automatically conducted by the signal control center 240. The coupling panel driving signal may be applied to the boundary driver 230 and the first and the second panel drivers DD1 and DD2 on a basis of the coupling pixel array.

Accordingly, the enlarged dark portion of the tiled display device 500 may be eliminated from the boundary area B and the pixel size of the tiled display device 500 may increase as many as the boundary pixels BP as well as the first and the second panel pixels PP1 and PP2.

The coupling display device 200 may have substantially the same structures and configurations of the coupling display device 200 as described in detail with references to FIGS. 1 to 8. Thus, any further detailed descriptions on the coupling display device 200 will be omitted.

When the coupling panel structure 410 and the boundary display panel 210 may be secured into a chassis or a frame, the tiled display device 500 may be provided as a display product.

Figure 10:
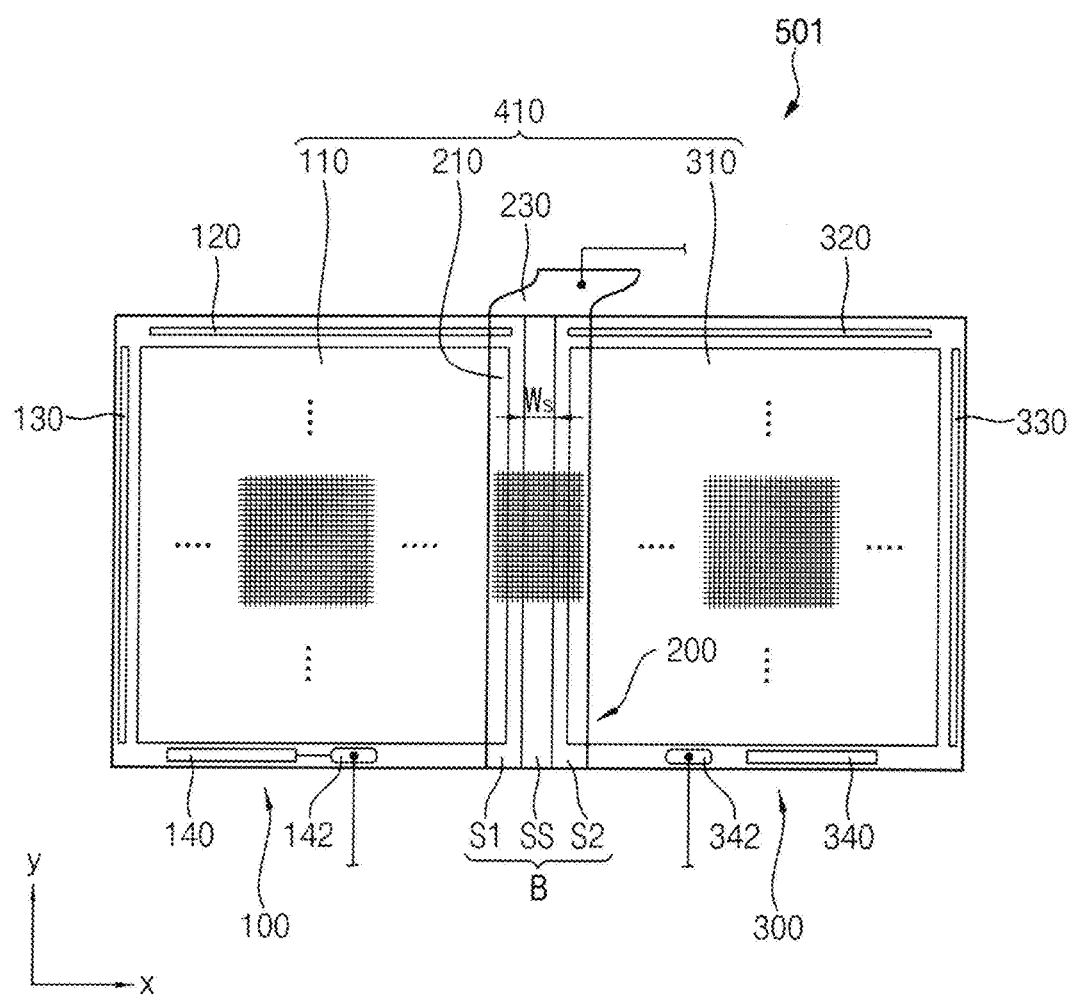
FIG. 10 is a structural view illustrating a tiled display device including the coupling display device shown in FIG. 1 in accordance with an alternative embodiment of the invention.

FIG. 10 is a structural view illustrating a tiled display device including the coupling display device shown in FIG. 1 in accordance with an alternative embodiment of the invention.

The tiled display device 501 shown in FIG. 10 may have substantially the same structures as the tiled display device 500 shown in FIG. 9, except that the first and the second element display panels 110 and 310 may be spaced apart and a separation space SS may be provided between the first and the second element display panels 110 and 310. The same or like elements shown in FIG. 10 have been labeled with the same reference characters as used above to describe the embodiment of the tiled display device 500 shown in FIG. 9, and any repetitive detailed description thereof will hereinafter be omitted or simplified.

Referring to FIG. 10, an embodiment of a tiled display device 501 may include the first and the second display devices 100 and 300 that may be spaced apart in the first direction x by a separation space SS. Thus, the boundary area B between the first element display panel 110 and the second element display panel 310 may include the first seam area S1, the separation space SS and the second seam area S2, such that the width of the boundary display panel 210 may increase by a space width Ws of the separation space SS.

Accordingly, the boundary pixels BP of the boundary display panel 210 may also increase in proportional to the space width Ws, to thereby improve the image quality of the tiled display device 501.

In such an embodiment, where the boundary display panel 210 is provided as the flexible panel, the tiled display device 500 may be bent or folded symmetrically with respect to the separation space SS. In such an embodiment, the first element display panel 110 and the second element display panel 310 may overlap each other with respect to the separation space SS.

Thus, in such an embodiment, when the tiled display device 501 is unfolded, the first element display panel 110, the boundary display panel 210 and the second element display panel 310 may be arranged side by side in the tiled display device. In such an embodiment, when the tiled display device 501 may is folded, the second element display panel 310 may be folded to overlapped the first element display panel 110 with respect to the separation space SS, to thereby reduce a size of the tiled display device 501.

In an embodiment, the frame or the chassis into which the first and the second element display panels 110 and 310 and the boundary display panel 210 may be secured may also include an elastic portion or a flexible portion corresponding to the separation space of the boundary area B.

Thus, a display product including the tiled display device 501 may also be folded or bent over in a way such that the first and the second element display panels 110 and 310 are disposed to overlap each other.

According to the embodiments of the invention, a pair of the element display devices may be coupled with the coupling display device at the neighboring seam areas. Thus, the element display devices and the coupling display device may constitute the tiled display device that may be operated by a single coupling panel driving signal. Thus, the coupling display panel may be coupled to the neighboring seam areas of the element display panels without any damages to the element display panels, to thereby improve the reliability and stability of the tiled display device.

In such embodiments, as the coupling display device may be positioned at the boundary area between the element display devices as an additional display device, the pixel number of the tiled display device may easily increase as many as the pixel number of the coupling display device In such embodiments, the operation mode of the tiled display device may be easily selected among the single panel mode and the multi panel mode based on the operation of the mode selector according to the user's instruction, to thereby improve the use of ease and the facility of the tiled display device.

In such embodiments, the coupling display device may include a flexible display panel, such that the element display devices may be folded or bent over each other with respect to the separation space of the boundary area, to thereby reduce the storage space for the tiled display device.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A tiled display device comprising:
   a plurality of element display devices, each including an element display panel which defines a display area and a panel driver disposed on a seam area surrounding the display area; and
   a coupling display device disposed on the element display devices, wherein the coupling display device is coupled to the element display devices at neighboring seam areas of element display panels thereof, and the neighboring seam areas are covered by the coupling display device,
   wherein the coupling display device includes:
      a boundary display panel disposed on the neighboring seam areas of the element display panels of the neighboring element display devices;
      a coupler which couples the boundary display panel with the element display panels to provide a coupling panel structure;
      a boundary driver disposed at an end portion of the boundary display panel to drive the boundary display panel; and
      a signal control center disposed at an exterior of the boundary display panel and connected to the boundary driver and panel drivers of the neighboring element display devices to drive the coupling panel structure to operate in response to a coupling panel driving signal which is converted from a panel driving signal for individually driving the element display panels.

2. The tiled display device of claim 1, wherein the coupler includes an adhesive interposed between a front surface of the neighboring seam areas of the element display panels and a lower surface of the boundary display panel.

3. The tiled display device of claim 1, wherein the signal control center includes:
   a connector connected to the boundary driver and the panel drivers;
   a signal processor which processes the panel driving signal for driving the element display panels to generate the coupling panel driving signal and applies the coupling panel driving signal to the coupling panel structure such that the coupling panel structure operates in response to the coupling panel driving signal; and
   a mode selector which selects an operation mode of the coupling panel structure by selectively connecting the signal processor to the boundary driver.

4. The tiled display device of claim 3, wherein the signal processor incudes:
   a pixel converter which detects panel pixel arrays of the element display panels of the neighboring element display devices and a boundary pixel array of the boundary display panel to define a coupling pixel array of the coupling panel structure from the panel pixel arrays and the boundary pixel array; and
   a coupling panel driver which converts data signals and scan signals of the panel driving signal into converted data signals and converted scan signals of the coupling panel driving signal and applies the converted data signals and the converted scan signals to the boundary driver and the panel drivers.

5. The tiled display device of claim 3, wherein
   the operation mode of the coupling panel structure includes a single panel mode, in which the boundary driver is activated and the element display panels function integrally as a single display panel, and a multi panel mode, in which the boundary driver is not activated and the element display panels function individually; and
   the signal processor includes a gradation operator which operates the boundary driver in the multi panel mode such that a whole gradation of the boundary display panel is similar to edge gradations of the element display panels symmetric with each other with respect to the boundary display panel.

6. The tiled display device of claim 1, wherein
   the neighboring seam areas are separated from each other by a separation space, and
   the boundary display panel is bent with respect to the separation space such that the element display panels of the neighboring element display devices are disposed to overlap each other.

7. A coupling display device of a tiled display device, comprising:
   a boundary display panel disposed on a plurality of element display panels of the tiled display device, wherein each of the element display panels includes a display area and a seam area surrounding the display area, and the boundary display panel is disposed to cover neighboring seam areas of neighboring element display panels;

a coupler which couples the boundary display panel with the neighboring element display panels to provide a coupling panel structure;

a boundary driver disposed at an end portion of the boundary display panel to drive the boundary display panel; and a signal control center disposed at an exterior of the boundary display panel and connected to the boundary driver to drive the coupling panel structure to operate in response to a coupling panel driving signal.

8. The coupling display device of claim 7, wherein
the boundary display panel includes a bent portion bent over toward a rear portion of the neighboring element display panels, and the coupler includes a protruding member protruded from a rear surface of the bent portion.

9. The coupling display device of claim 8, wherein the protruding member includes a magnetic body secured to a rear surface of the neighboring element display panels by a magnetic force.

10. The coupling display device of claim 8, wherein the boundary driver includes a display drive integrated circuit package which is detachably secured to the bent portion and is disposed on the rear portion of the neighboring element display panels.

11. The coupling display device of claim 7, wherein the coupler includes an adhesive interposed between a front surface of the neighboring seam areas of the neighboring element display panels and a lower surface of the boundary display panel.

12. The coupling display device of claim 11, wherein
the boundary display panel and the adhesive is protruded from a front surface of the neighboring seam areas of the neighboring element display panels, and the boundary display panel and the adhesive has a thickness in a range of 120 μm to 150 μm.

13. The coupling display device of claim 7, wherein
the coupler includes an aligning groove on the lower surface of the boundary display panel in correspondence with an aligning protrude protruding from a front surface of the neighboring seam areas, the aligning protrude is inserted into the aligning groove in a way such that a pixel row of panel pixels of the element display panels is aligned with a pixel row of boundary pixels of the boundary display panel in a same line to thereby form a pixel row of the coupling panel structure.

14. The coupling display device of claim 7, wherein the signal control center includes:

a connector connected to the boundary driver and panel drivers for driving the element display panels;

a signal processor which processes a panel driving signal for driving at least one of the element display panels to generate the coupling panel driving signal and applies the coupling panel driving signal to the coupling panel structure such that the coupling panel structure is operated in response to the coupling panel driving signal; and a mode selector which selects an operation mode of the coupling panel structure by selectively connecting the signal processor to the boundary driver.

15. The coupling display device of claim 14, wherein the signal processor includes:

a pixel converter which detects panel pixel arrays of the neighboring element display panels and a boundary pixel array of the boundary display panel to define a coupling pixel array of the coupling panel structure from the panel pixel arrays and the boundary pixel array; and a coupling panel driver which converts data signals and scan signals of the panel driving signal into converted data signals and converted scan signals of the coupling panel driving signal and applies the converted data signals and the converted scan signals to the coupling panel structure on a basis of the coupling panel pixel array.

16. The coupling display device of claim 15, wherein the coupling panel driver includes a data interpolation unit which interpolates the converted data signals in a way such that an image data of no image pixel of the coupling pixel array is inferred from an image data of a pair of pixels neighboring the no image pixel.

17. The coupling display device of claim 14, wherein the mode selector includes:

a signal regulator which regulates a signal transfer between the signal processor and the boundary driver; and a user interface which controls the signal regulator.

18. The coupling display device of claim 17, wherein
the signal regulator includes a switch device which selectively connects or disconnects the signal processor with the boundary driver such that the boundary driver is selectively activated, and the coupling panel structure operates in one of a single panel mode, in which the boundary driver is activated and the element display panels function integrally as a single display panel, and a multi panel mode, in which the boundary driver is not activated and the element display panels function individually.

19. The coupling display device of claim 18, wherein the signal processor includes a gradation operator which operates the boundary driver in the multi panel mode such that a whole gradation of the boundary display panel is similar to edge gradations of the element display panels symmetric with each other with respect to the boundary display panel.

20. The coupling display device of claim 19, wherein the gradation of the boundary display panel is a mean value of the gradation data of panel pixels of the neighboring element display panel which are closest to the boundary display panel and opposite to each other with respect to the boundary display panel.

* * * * *